(12) United States Patent
Mo et al.

(10) Patent No.: US 10,560,111 B2
(45) Date of Patent: Feb. 11, 2020

(54) NESTED CASCADED MIXED-RADIX DIGITAL DELTA-SIGMA MODULATOR

(71) Applicant: University College Cork—National University of Ireland, Cork, Cork (IE)

(72) Inventors: Hongjia Mo, Cork (IE); Michael Peter Kennedy, Cork (IE)

(73) Assignee: University College Cork-National University of Ireland, Cork, Cork (IE)

( * ) Notice: Subject to any disclaimer, the term of this patent is extended or adjusted under 35 U.S.C. 154(b) by 0 days.

(21) Appl. No.: 16/117,361

(22) Filed: Aug. 30, 2018

(65) Prior Publication Data

US 2019/0068207 A1    Feb. 28, 2019

Related U.S. Application Data

(60) Provisional application No. 62/552,072, filed on Aug. 30, 2017.

(51) Int. Cl.
*H03L 7/197* (2006.01)
*H03M 7/36* (2006.01)
*H03M 3/00* (2006.01)
*H03L 7/093* (2006.01)

(52) U.S. Cl.
CPC .......... *H03L 7/1976* (2013.01); *H03M 3/438* (2013.01); *H03M 7/3022* (2013.01); *H03L 7/093* (2013.01)

(58) Field of Classification Search
CPC ... H03L 7/093; H03L 7/16; H03L 7/18; H03L 7/197; H03L 7/1976; H03L 7/1978; H03M 3/30; H03M 3/39; H03M 3/436; H03M 3/438; H03M 3/44; H03M 3/442; H03M 3/444; H03M 3/446; H03M 3/448; H03M 3/45; H03M 3/452; H03M 3/454; H03M 7/3004; H03M 7/3015; H03M 7/3017; H03M 7/302; H03M 7/3022; H03M 7/3031; H03M 7/3033; H03M 7/3042

See application file for complete search history.

(56) References Cited

U.S. PATENT DOCUMENTS 8,816,724 B2    8/2014  Kennedy
2015/0055737 A1*    2/2015  Bourdi .................. H03M 3/436
                                                              375/350

OTHER PUBLICATIONS

ADF4155: Integer-N/Fractional-N PLL Synthesizer, Analog Devices. [Online]. Available: http://www.analog.com/media/en/technical-documentation/data_sheets/ADF4155.pdf in 32 pages.

(Continued)

*Primary Examiner* — Lincoln D Donovan
*Assistant Examiner* — Diana J. Cheng
(74) *Attorney, Agent, or Firm* — Knobbe, Martens, Olson & Bear, LLP

(57) ABSTRACT

A nested mixed-radix DDSM can guarantee zero systematic frequency error when used as a divider controller in a fractional-N frequency synthesizer is described. This disclosure presents a nested cascaded mixed-radix DDSM architecture which can also guarantee zero systematic frequency error. In addition, the disclosure allows one to use higher order auxiliary modulators and shaped dither signal to eliminate feedthrough spurs completely. By increasing the number of levels in the cascade, the moduli of the individual modulator stages can be reduced, thereby increasing the speed of the synthesizer.

20 Claims, 8 Drawing Sheets

(56) References Cited

OTHER PUBLICATIONS

K. Hosseini and M. Kennedy, Minimizing Spurious Tones in Digital Delta-Sigma Modulators, ser. Analog Circuits and Signal Processing. Springer New York, 2011. [Online]. Available: https://books.google.ie/books?id=a2wEMqE9nk8C in 160 pages.

M. P. Kennedy, H. Mo, B. Fitzgibbon, A. Harney, H. Shanan, and M. Keaveney, "0.3-4.3 GHz Frequency-Accurate Fractional-N Frequency Synthesizer With Integrated VCO and Nested Mixed-Radix Digital-Modulator-Based Divider Controller," IEEE Journal of Solid-State Circuits, vol. 49, No. 7, pp. 1595-1605, Jul. 2014, in 11 pages.

S. Pamarti and I. Galton, "LSB dithering in MASH delta-sigma D/A converters," IEEE Trans. Circuits Syst. I, Reg. Papers, vol. 54, No. 4, pp. 779-790, Apr. 2007, in 12 pages.

\* cited by examiner

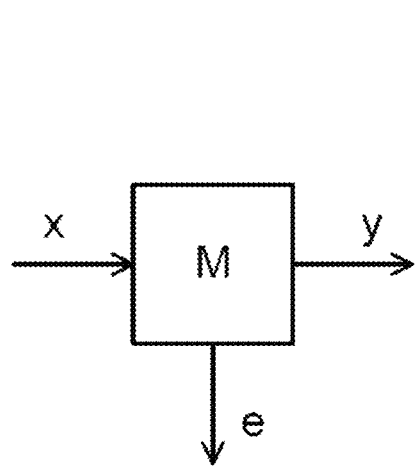
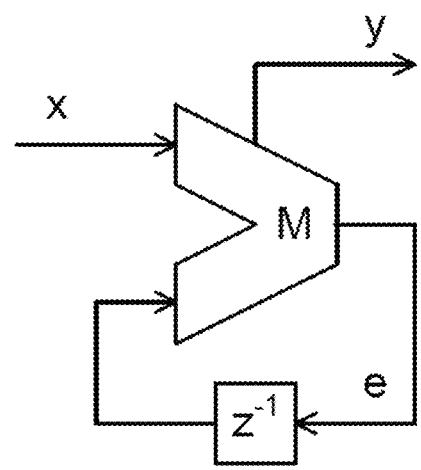
Figure 3A
(Prior Art)
Figure 3B
(Prior Art)
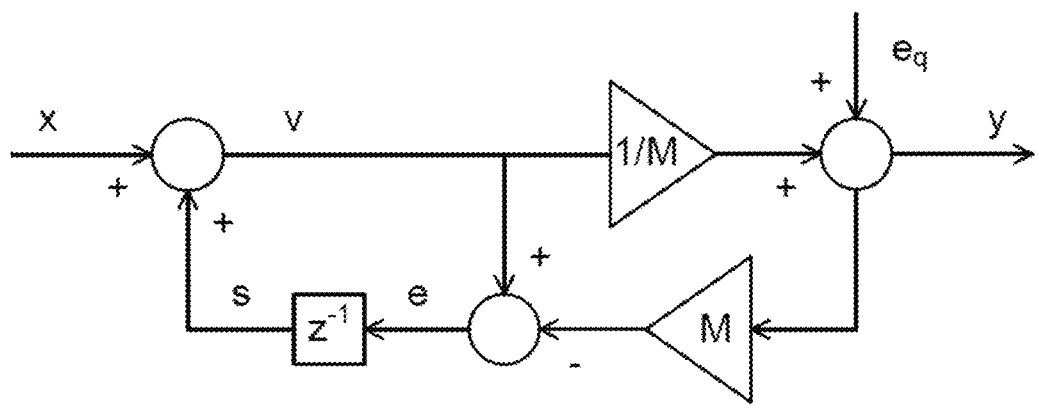
Figure 3C
(Prior Art)

NESTED CASCADED MIXED-RADIX DIGITAL DELTA-SIGMA MODULATOR

CROSS-REFERENCE TO RELATED APPLICATIONS

This application claims the benefit of priority under 35 U.S.C. § 119(e) of U.S. Provisional Patent Application No. 62/552,072, filed Aug. 30, 2017 and titled "NESTED CASCADED MIXED-RADIX DIGITAL DELTA-SIGMA MODULATOR," which is herein incorporated by reference in its entirety for all purposes.

BACKGROUND

Field

This disclosure relates to synthesizing radio frequencies using a frequency synthesizer in order to output a desired frequency.

Background

Fractional-N frequency synthesizers are widely used to generate programmable carrier frequencies for wireless devices.

Wireless communication devices communicate by sending and receiving information in particular radio frequencies. These particular radio frequencies can be communication channels, just like channels on a radio. In order to receive a particular station on a radio, it is important to tune to the radio frequency that station is broadcast on. If one does not tune directly onto the proper frequency that the radio station is being broadcast on, then the radio will likely receive static or a signal that is not as clear.

Wireless communication devices typically use a frequency synthesizer to set the frequency of the communication channel. Just like the radio example above, it can be important for reliable and efficient wireless communications to have accurate and precise generation of specific radio frequencies. In order to generate the specific radio frequencies the frequency synthesizer often needs to create the desired frequency using reference frequencies. It can be difficult to produce a frequency synthesizer that is precise without the design of the frequency synthesizer becoming very complicated.

SUMMARY

The present disclosure provides methods and systems for a radio frequency synthesizer to generate precise frequencies over a large radio frequency range.

Accordingly there is provided a fractional-N frequency synthesizer comprising a divider controller having a main $n^{th}$ order modulator and an auxiliary $n^{th}$ order modulator, wherein the noise shaping of the auxiliary $n^{th}$ order modulator is the same order as the main $n^{th}$ order modulator and n is an integer value greater than one.

In one embodiment the auxiliary $n^{th}$ order modulator comprises at least two first-order Error Feedback Modulator (EFM$_1$) stages.

In one embodiment at least one error feedback modulator stage in the auxiliary modulator is configured to apply a dither signal to the main $n^{th}$ order modulator.

In one embodiment the at least two Error Feedback-Modulator (EFM$_1$) stages modulator provides a nested (level-2) auxiliary modulator.

In one embodiment the auxiliary modulator is implemented as three Error Feedback-Modulator (EFM$_1$) stages with modulus M2.

In one embodiment the divider controller contains a single error cancellation network.

In one embodiment the speed of operation of the divider controller can be increased by splitting the power-of-two modulus over more than one level and wherein the main $n^{th}$ order modulator has a power-of-two modulus and the modulus of the auxiliary $n^{th}$ order modulator is not a power-of-two.

In one embodiment a non-power-of-two modulus can also be split over multiple levels.

In one embodiment the stages of the auxiliary modulator and the main modulator are connected in a two-level nested cascade.

In one embodiment error feedback modulator stages are connected in a two-level nested cascaded MASH DDSM with a single error cancellation network and a separate dither signal applies an LSB dither.

In one embodiment there is provided additional modulator stages, so that the auxiliary modulator is a third-order system.

In one embodiment the sizes of the individual moduli are reduced, by cascading modulator stages over more than two levels.

In one embodiment the order of the auxiliary modulator is three and its spectrum is spur-free.

In one embodiment the order of the main and auxiliary modulator is four.

In one embodiment the LSB dither component of the dither signal is first-order shaped.

In one embodiment the dither component protrudes above the spectral envelope of the contribution from the higher-order main modulator at low frequencies, and is scaled by a factor $$\left(\frac{1}{M_1 M_2}\right)^2.$$

In one embodiment there is provided a four-level nested cascaded MASH 1-1-1 DDSM wherein the dither signal provides a first-order shaped additive LSB dither.

In another embodiment there is provided a modulator system for use in a fractional-N frequency synthesizer, said modulator system comprising a divider controller having a main $n^{th}$ order modulator and an auxiliary $n^{th}$ order modulator, wherein the noise shaping of the auxiliary $n^{th}$ order modulator is the same order as the main $n^{th}$ order modulator and n is an integer value greater than one.

In a further embodiment there is provided a fractional-N frequency synthesizer comprising a divider controller having a main $n^{th}$ order modulator and an auxiliary $n^{th}$ order modulator, wherein the auxiliary $n^{th}$ order modulator and the main $n^{th}$ order modulator comprises an integer value greater than one.

In a further embodiment there is provided a fractional-N frequency synthesizer comprising a divider controller having a main $n^{th}$ order modulator and an auxiliary $k^{th}$ order modulator, wherein the value of n or k comprises an integer number greater than one.

One disadvantage of the prior art is the potential for spur feedthrough because the noise shaping in the auxiliary modulator is not effective (principally because it is forced to be first order, and first-order modulators do not introduce sufficiently randomized quantization noise). According to one embodiment the way to solve the problem is to use higher order noise shaping in the auxiliary modulator.

By adding more stages at the second level, y contains a contribution $e_{q2,3}$ that is noiselike. In one embodiment, as the noise shaping at the second level is third order, dither can be added at level 2, effectively eliminating the feedthrough spurs.

The prior art comprises a main modulator (3×EFM1 stages with modulus $M_1$ plus an error cancellation network [the filter which combines $y_{1,1}$, $y_{1,2}$, and $y_{1,3}$ to produce y]) and an auxiliary modulator (1×EFM1 stage with modulus $M_2$).

The standard way to increase the order of noise-shaping in the auxiliary modulator would be to use three EFM1 stages, then to combine their outputs using a second error cancellation network like that of the main modulator, and to add the result to $x_1$ at the input to the main modulator.

In one embodiment the auxiliary modulator is implemented as 3×EFM1 stages with modulus $M_2$.

Instead of combining the outputs $y_{2,1}$, $y_{2,2}$, and $y_{2,3}$ using an error cancellation network and adding the result to $x_1$ at the input of the main modulator, one can pass the outputs directly to the next stages. The error cancellation network of the main modulator does the required noise shaping; the auxiliary modulator does not require its own separate error cancellation network.

The problem of potential spurs in the prior art due to a low order auxiliary modulator is solved by adding more non power-of-two stages at level 2, without an extra error cancellation network.

In one embodiment the speed can be increased by splitting the power-of-two modulus over more than one level. The non-power-of-two modulus can also be split over multiple levels. The total divisor M is expanded as a product of integers $M_1, M_2, \ldots, M_L$, where L is the number of levels and $M_i$ is the modulus at level i.

A conventional mixed-radix digital delta-sigma modulator (DDSM) has a low-order auxiliary DDSM and a higher-order main DDSM. In some operating conditions, the low-order DDSM may exhibit low frequency periodic behaviour that feeds through and manifests itself as spurs at the output of the main DDSM. A nested cascaded DDSM architecture described herein does not suffer from such feedthrough spurs.

Eliminating feedthrough spurs will yield cleaner carriers for a range of applications including communications, instrumentation and radar.

In one embodiment adding extra levels in the cascade yields and advantage in terms of speed.

BRIEF DESCRIPTION OF THE DRAWINGS

The invention will be more clearly understood from the following description of an embodiment thereof, given by way of example only, with reference to the accompanying drawings.

FIG. 3A illustrates each first-order Error Feedback Modulator (EFM1) of the DDSM of FIG. 2.

FIG. 3B illustrates a first-order EFM1 implemented as an accumulator, where e denotes the sum and y is the carry out.

FIG. 3C illustrates a simplified block diagram of a modulo-M EFM1, where the quantizer is modelled by a gain (1/M) and additive noise $e_q$.

DETAILED DESCRIPTION OF THE DRAWINGS

Figure 1:
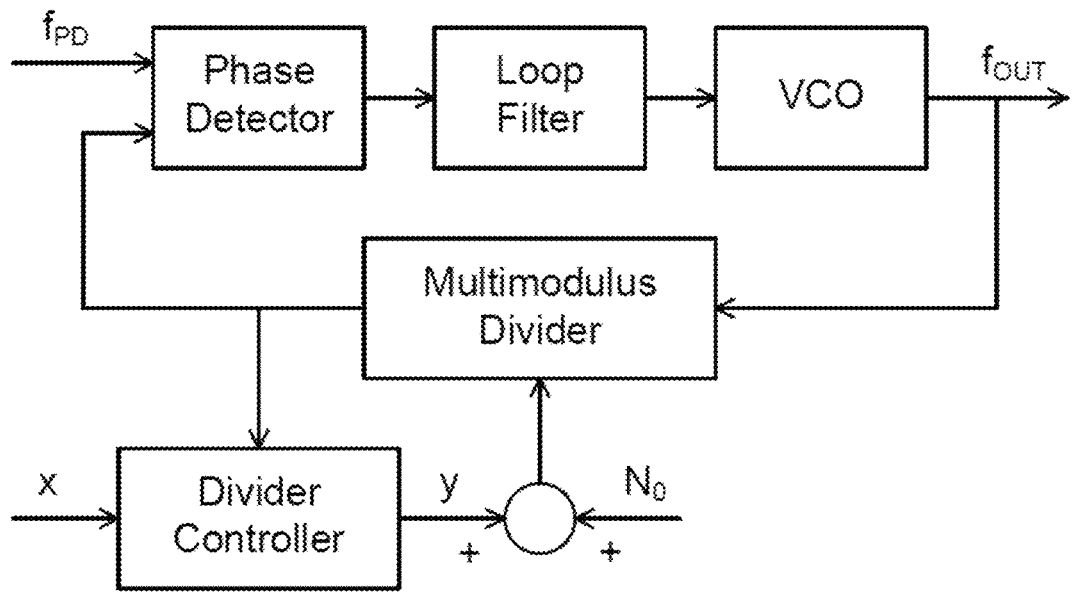
FIG. 1 illustrates a block diagram of a fractional-N frequency synthesizer.

Fractional-N frequency synthesizers are ubiquitously deployed in modern communication systems. The fractional-N synthesizer, shown schematically in FIG. 1, comprises a controlled variable frequency oscillator, a precise frequency reference, and a control loop to lock the output frequency to a rational multiple of the reference frequency. The multi-modulus divider controller in the feedback path is controlled by a divider controller.

Zero systematic frequency error can be achieved in a fractional-N frequency synthesizer by using a nested mixed-radix digital delta-sigma modulator (DDSM) as the divider controller. Such a fractional-N frequency synthesizer architecture is disclosed in U.S. Pat. No. 8,816,724, issued Aug. 26, 2014, assigned to the assignee of the present disclosure, and which is incorporated herein by reference in its entirety for all purposes.

For some combinations of inputs, initial conditions, and moduli, however, the nested DDSM may suffer from feedthrough spurs. This disclosure solves the problem, thereby improving performance.

Figure 2:
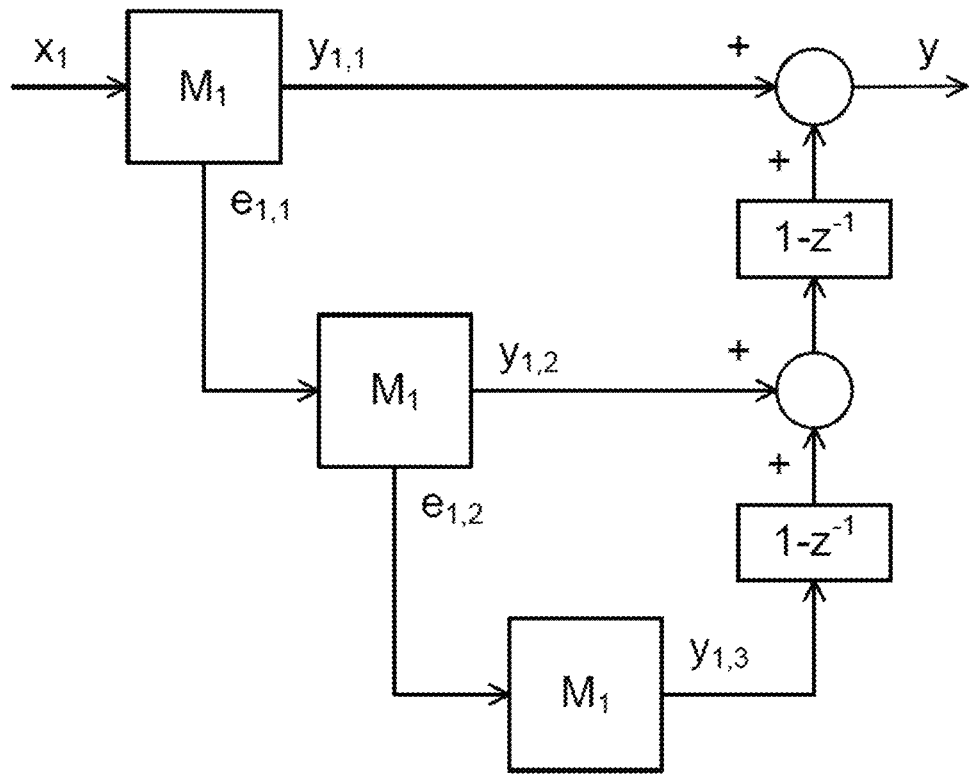
FIG. 2 illustrates a block diagram of a conventional MASH 1-1-1 DDSM.

A common MASH 1-1-1 architecture is shown in FIG. 2. It comprises three first-order error feedback modulators (denoted EFM1) and an error cancellation network. Each EFM1 stage (FIG. 3A) is typically implemented as a modulo-M adder and register, as shown in FIG. 3B, where e denotes the sum and y is the carry out. Following the classical model of quantization K. Hosseini and M. Kennedy, Minimizing Spurious Tones in Digital Delta-Sigma Modulators, ser. Analog Circuits and Signal Processing.

Springer New York, 2011. [Online]. Available: https://books.google.ie/books?id=a2wEMqE9nk8C, the quantizer is modelled as a gain element and an additive signal $e_q$, as shown in FIG. 3C.

The z-transform of the output y of the EFM1 in FIG. 3C is given by:

$$Y(z) = \frac{1}{M}X(z) + (1-z^{-1})E_q(z),$$

where X and $E_q$ are the z-transforms of the input x and quantization error $e_q$, respectively.

The z-transform of the output y of the MASH 1-1-1 DDSM in FIG. 2 is given by:

$$Y(z) = Y_{1,1}(z) + (1-z^{-1})Y_{1,2}(z) + (1-z^{-1})^2 Y_{1,3}(z)$$

with $$Y_{1,1}(z) = \frac{1}{M_1}X_1(z) + (1-z^{-1})E_{q1,1}(z),$$

$$Y_{1,2}(z) = \frac{1}{M_1}E_{1,1}(z) + (1-z^{-1})E_{q1,2}(z),$$

$$Y_{1,3}(z) = \frac{1}{M_1}E_{1,2}(z) + (1-z^{-1})E_{q1,3}(z),$$

where $$E_{1,1}(z) = -M_1 E_{q1,1}(z),$$

$$E_{2,1}(z) = -M_1 E_{q1,2}(z).$$

Substituting, one can obtain $$Y(z) = \frac{1}{M_1}X_1(z) + (1-z^{-1})^3 E_{q1,3}(z),$$

Figure 4:
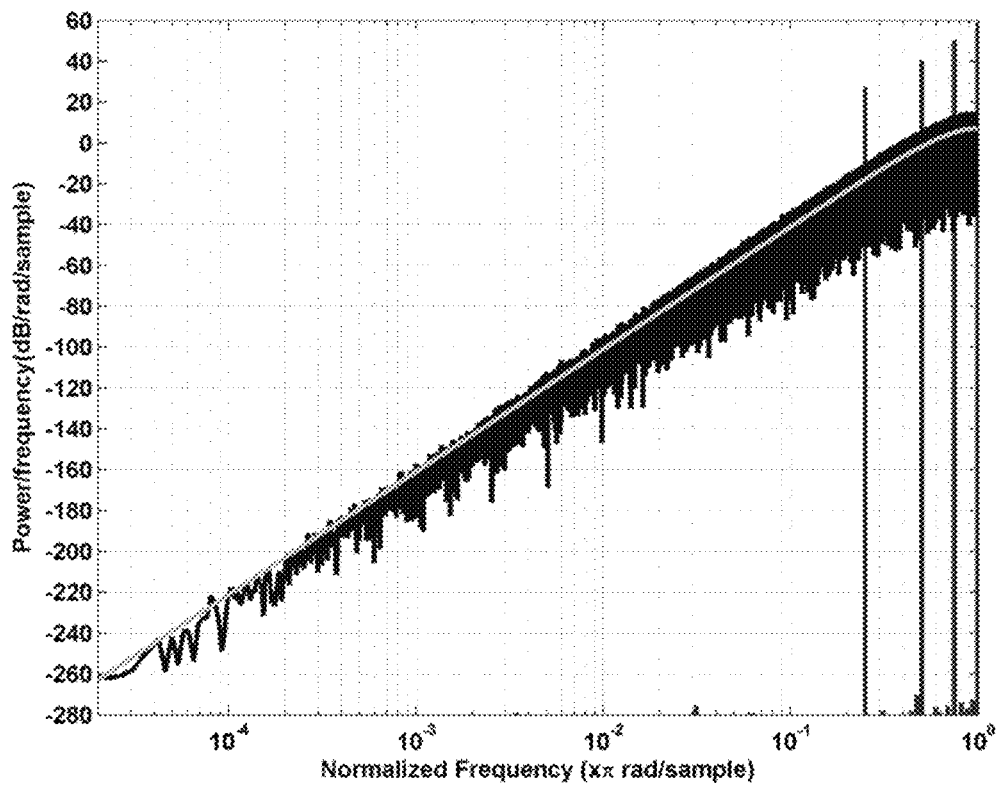
FIG. 4 illustrates the simulated power spectrum of the output y.

If $x_1=N_1$, then y contains a DC component equal to $N_1/M_1$, as required, and third-order highpass-filtered quantization noise. In the ideal case, $E_{q1,3}$ is white noise and the shaped quantization noise is defined by:

$$S_Y(f) = \frac{1}{12}\left(2\sin\left(\frac{\pi f}{f_s}\right)\right)^6, \quad (1)$$

as shown by straight line starting at −260 dB in FIG. 4. When $E_{q1,3}$ is white, the simulated spectrum of the quantization noise is third-order shaped, and is approximated well by a straight line curve defined by Eq. (1). In practice, periodic behavior may be observed, as shown by the tones shown on the right. $x_1=N_1=3M_1/4$ in both cases. The (long) noiselike trajectory is started from an odd initial condition; the (short) periodic red trajectory is started from the zero initial condition.

In practice, the quantization noise may be periodic when the input to the DDSM is constant, as happens in the case of the tones on the right of FIG. 4. When used as a divider controller in a fractional-N frequency synthesizer, a classical MASH DDSM can thereby produce spurious tones in the output spectrum due to this underlying periodic behavior in the modulator. The usual solution to this problem is to add a pseudorandom dither signal to the input, as described in S. Pamarti and I. Galton, "LSB dithering in MASH delta-sigma D/A converters," IEEE Trans. Circuits Syst. I, Reg. Papers, vol. 54, no. 4, pp. 779-790, April 2007.

A second problem is a systematic frequency offset due to the choice of reference frequency and modulus. In a fractional-N frequency synthesizer with a multi-modulus divider and a DDSM-based division controller, we have $$f_{OUT} = \left(N_0 + \frac{N_1}{M_1}\right)f_{PD}. \quad (2)$$

$M_1$ is typically a power of two, meaning that it may not be possible to synthesize a desired output frequency exactly. For example, consider the problem of synthesizing $f_{OUT}=4225.6$ MHz when $f_{PD}=61.44$ MHz and $M_1=2^{18}$. The best approximation is:

$$f_{OUT} = \left(68 + \frac{203435}{262144}\right)61.44 \text{ MHz} \quad (3)$$

$$= 4225.600078125 \text{ MHz}, \quad (4)$$

giving a frequency error of approximately 78 kHz.

In order to reduce the systematic frequency error to zero, one can increase the modulus $M_1$. Today's commercially-available fractional-N synthesizers have $M_1$ as large as $2^{24}$ ADF4155: Integer-N/Fractional-N PLL Synthesizer, Analog Devices. [Online]. Available: http://www.analog.com/media/en/technical-documentation/data-sheets/ADF4155.pdf, allowing them to achieve extremely high frequency resolution.

$M_1$ is the modulus of the accumulator. Increasing $M_1$ causes the computation time and power of the divider controller to increase. An alternative way of obtaining zero systematic frequency error without increasing $M_1$ is to use additional modulators in a nested structure, the modulus of at least one modulator of which is not a power of two. Such a method is shown in M. P. Kennedy, H. Mo, B. Fitzgibbon, A. Harney, H. Shanan, and M. Keaveney, "0.3-4.3 GHz Frequency-Accurate Fractional-N Frequency Synthesizer With Integrated VCO and Nested Mixed-Radix Digital-Modulator-Based Divider Controller," IEEE Journal of Solid-State Circuits, vol. 49, no. 7, pp. 1595-1605, July 2014.

Nested MASH DDSM

Figure 5:
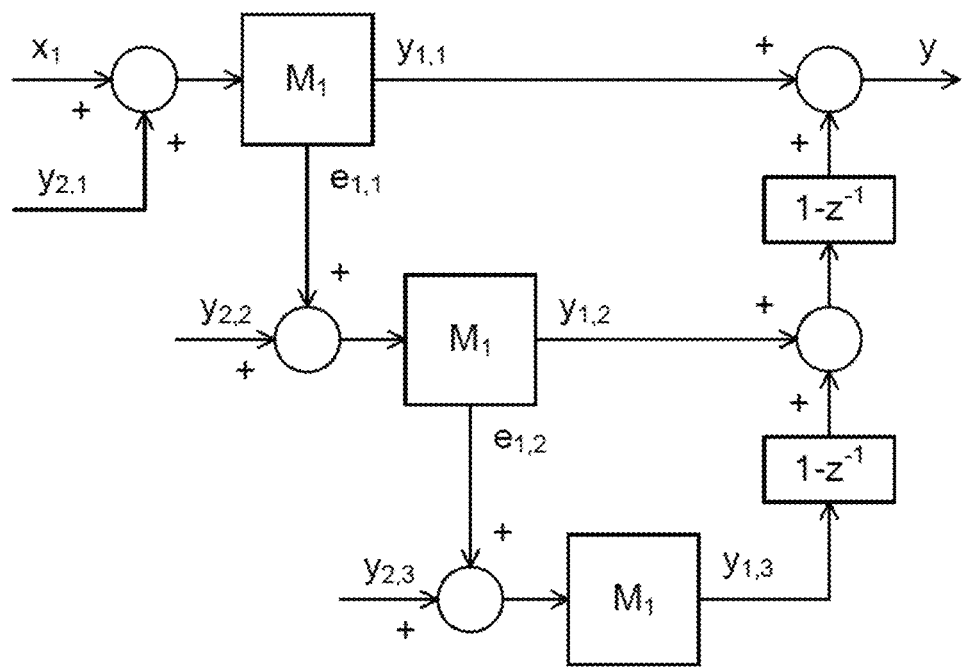
FIG. 5 illustrates a block diagram of a MASH 1-1-1 DDSM with auxiliary inputs ($y_{2,1}$, $y_{2,2}$, and $y_{2,3}$) to each of its stages.

Consider the modified MASH 1-1-1 shown in FIG. 5 which has auxiliary inputs to each of its stages. In this case:

$$Y_{1,1}(z) = \frac{1}{M_1}(X_1(z) + Y_{2,1}(z)) + (1-z^{-1})E_{q1,1}(z),$$

$$Y_{1,2}(z) = \frac{1}{M_1}(E_{1,1}(z) + Y_{2,2}(z)) + (1-z^{-1})E_{q1,2}(z),$$

$$Y_{1,3}(z) = \frac{1}{M_1}(E_{1,2}(z) + Y_{2,3}(z)) + (1-z^{-1})E_{q1,3}(z),$$

giving $$Y(z) = \frac{1}{M_1}X_1(z) + (1-z^{-1})^3 E_{q1,3}(z) +$$

$$\frac{1}{M_1}(Y_{2,1}(z) + (1-z^{-1})Y_{2,2}(z) + (1-z^{-1})^2 Y_{2,3}(z)).$$

In many state-of-the-art MASH 1-1-1 architectures, $y_{2,1}$ or $y_{2,2}$ is an additive pseudorandom dither signal, corresponding to zeroth- and first-order shaped additive LSB dither, respectively, as described in S. Pamarti and I. Galton, "LSB dithering in MASH delta-sigma D/A converters," IEEE Trans. Circuits Syst. I, Reg. Papers, vol. 54, no. 4, pp. 779-790, April 2007.

The signals may also be derived from auxiliary DDSMs. In the nested 1-3 MASH structure described in M. P. Kennedy, H. Mo, B. Fitzgibbon, A. Harney, H. Shanan, and M. Keaveney, "0.3-4.3 GHz Frequency-Accurate Fractional-N Frequency Synthesizer With Integrated VCO and Nested Mixed-Radix Digital Modulator-Based Divider Controller," IEEE Journal of Solid-State Circuits, vol. 49, no. 7, pp. 1595-1605, July 2014, for example, $y_{2,1}$ is the output of an auxiliary modulator with modulus $M_2$, while $y_{2,2}$ is a one-bit dither signal and $y_{2,3}=0$.

Example: Nested 1-3 MASH with Additive LSB Dither

Figure 6:
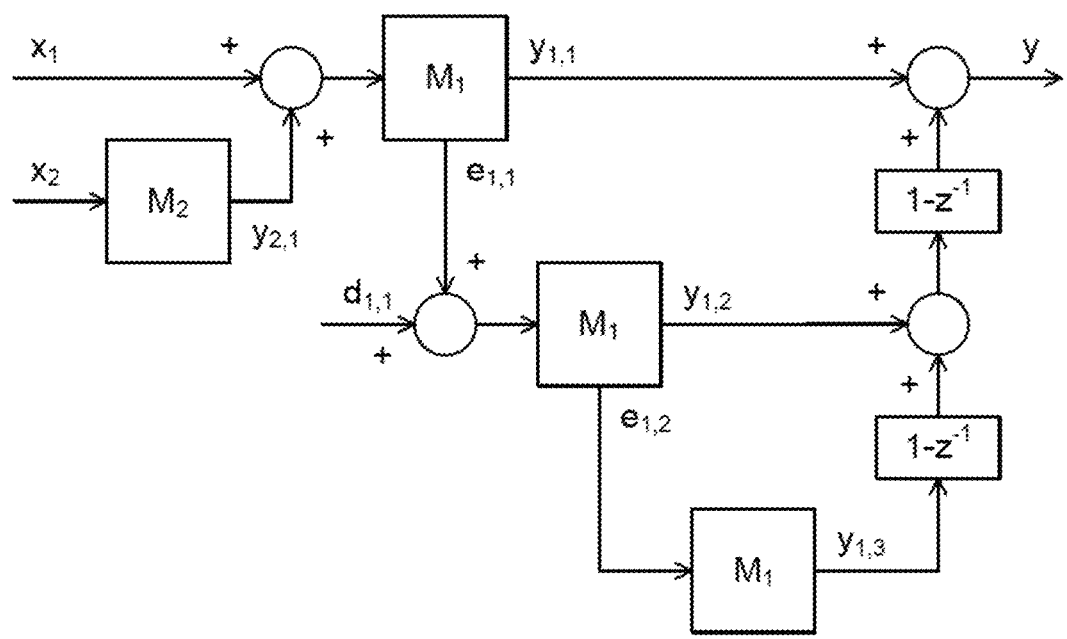
FIG. 6 illustrates a block diagram of a two-level nested 1-3 MASH DDSM with first-order shaped additive LSB dither.

FIG. 6 shows a nested 1-3 MASH structure M. P. Kennedy, H. Mo, B. Fitzgibbon, A. Harney, H. Shanan, and M. Keaveney, "0.3-4.3 GHz Frequency-Accurate Fractional-N Frequency Synthesizer With Integrated VCO and Nested Mixed-Radix Digital Modulator-Based Divider Controller," IEEE Journal of Solid-State Circuits, vol. 49, no. 7, pp. 1595-1605, July 2014. As shown in FIG. 6, the modulator at level 1 has three EFM1 stages, each with modulus $M_1$, while the auxiliary modulator at level 2 comprises a single EFM1 stage with modulus $M_2$.

A potential problem with the two-level nested MASH architecture in FIG. 6 is that the output y contains a contribution $e_{q2,1}$ from the undithered first-order auxiliary modulator. The auxiliary modulator at level 2 is first-order and undithered. Undithered EFM1s are notorious for producing periodic outputs. The periodic component of $e_{q2,1}$ appears in $y_{2,1}$ and adds directly to $x_1$ at the input of the level 1 modulator. This in turn gives rise to feedthrough spurs. Dither cannot be added at level 2 to whiten $e_{q2,1}$ and therefore cannot be used to solve the problem of feedthrough spurs.

Using the notation of FIG. 5, $$Y_{2,1}(z) = \frac{1}{M_2} X_2(z) + (1-z^{-1}) E_{q2,1}(z),$$

$$Y_{2,2}(z) = D_{1,1}(z),$$

$$Y_{2,3}(z) = 0$$

in this case. The z-transform of the output y is given by:

$$Y(z) = \frac{1}{M_1}\left(X_1(z) + \frac{1}{M_2} X_2(z)\right) + (1-z^{-1})^3 E_{q1,3}(z) + \frac{1}{M_1}(1-z^{-1}) E_{q2,1}(z).$$

When $x_1=N_1$ and $x_2=N_2$ are constants, the average value of the output y is equal to:

$$\frac{N_1 + \frac{N_2}{M_2}}{M_1}$$

In a fractional-N frequency synthesizer application, this architecture allows frequency steps that do not need to be equal to the reference divided by a power of two, as described in M. P. Kennedy, H. Mo, B. Fitzgibbon, A. Haney, H. Shanan, and M. Keaveney, "0.3-4.3 GHz Frequency-Accurate Fractional-N Frequency Synthesizer With Integrated VCO and Nested Mixed-Radix Digital Modulator-Based Divider Controller," IEEE Journal of Solid-State Circuits, vol. 49, no. 7, pp. 1595-1605, July 2014.

Consider again the problem of synthesizing $f_{OUT}=4225.6$ MHz when $f_{PD}=61.44$ MHz with $M_1=2^{18}$ and $M_2=3$. In this case, there is zero systematic frequency error:

$$f_{OUT} = \left(68 + \frac{203434 + \frac{2}{3}}{262144}\right) 61.44 \text{ MHz}$$

$$= 4225.6 \text{ MHz}.$$

The output spectrum contains third-order shaped quantization noise from $DDSM_1$ (at level 1), as before, as well as quantization noise from $DDSM_2$ (at level 2) that is only first-order shaped but is scaled by $$\frac{1}{M_1^2}.$$

Furthermore, $$S_Y(f) = \frac{1}{12}\left(2\sin\left(\frac{\pi f}{f_s}\right)\right)^6 \quad (5)$$

$$+ \frac{1}{12}\left(\frac{1}{M_1^2}\right)\left(2\sin\left(\frac{\pi f}{f_s}\right)\right)^2 \quad (6)$$

$$+ \frac{1}{4}\left(\frac{1}{M_1^2}\right)\left(2\sin\left(\frac{\pi f}{f_s}\right)\right)^2. \quad (7)$$

Figure 7:
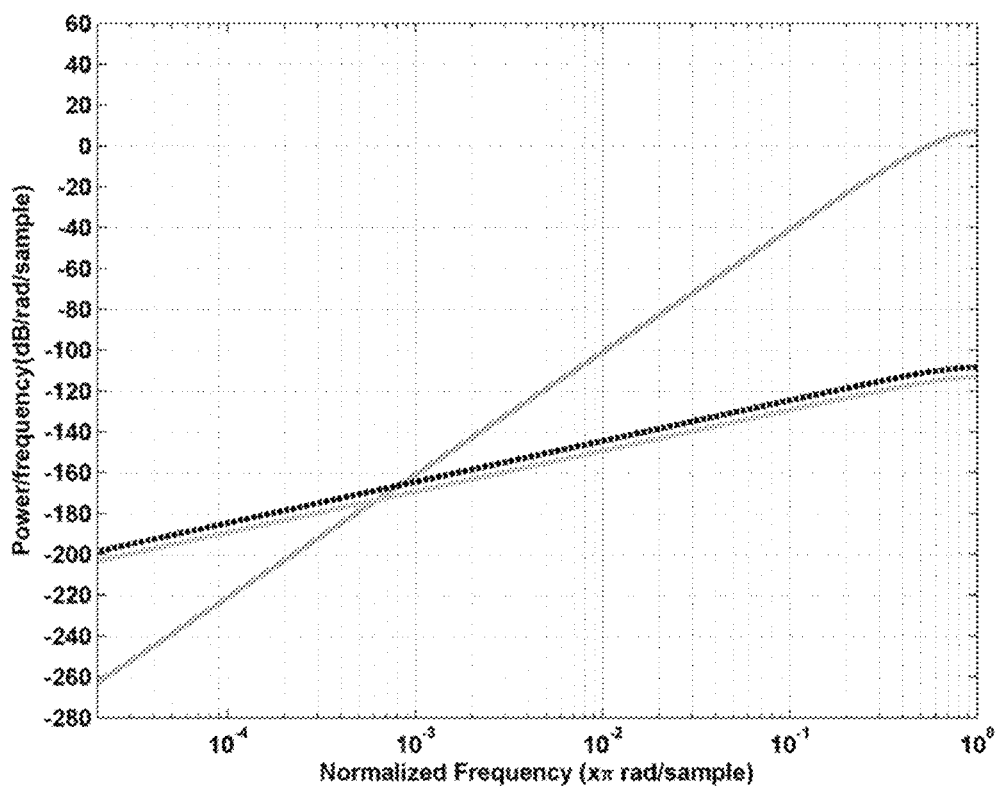
FIG. 7 illustrates idealized spectral contributions at the output of a nested 1-3 MASH DDSM with first-order shaped additive LSB dither.

The idealized spectral contributions predicted by Eqns. (5), (6) and (7) are shown in FIG. 7. The contributions of the main MASH 1-1-1, its dither, and the auxiliary EFM1 are shown with line having larger slope (beginning at −260 dB); solid line with smaller slope, and dashed line, respectively.

Figure 8:
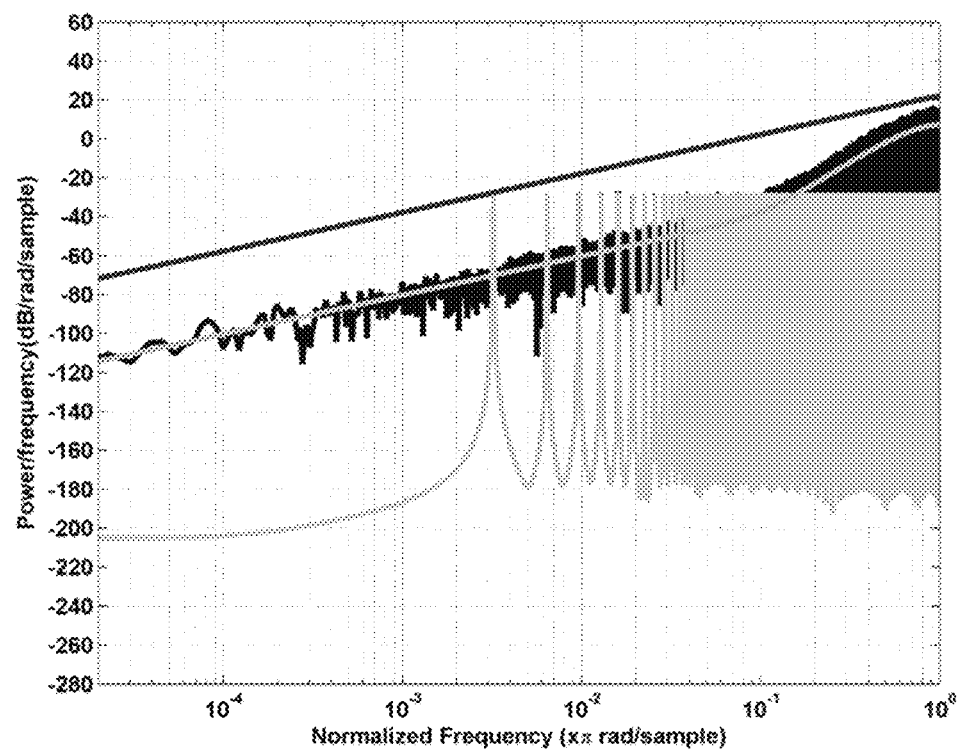
FIG. 8 illustrates a spectrum of an incorrectly designed nested 1-3 MASH DDSM that may exhibit spurs at low resolution bandwidths, in which $N_f=2^{18}$, $x_1=N_1=4$, $M_1=16$, $x_2=N_2=1$, $M_2=625$.

In the worst case, the signal $y_{2,1}$ is periodic. This can lead to feedthrough tones in the output spectrum, as shown in FIG. 8.

Figure 9:
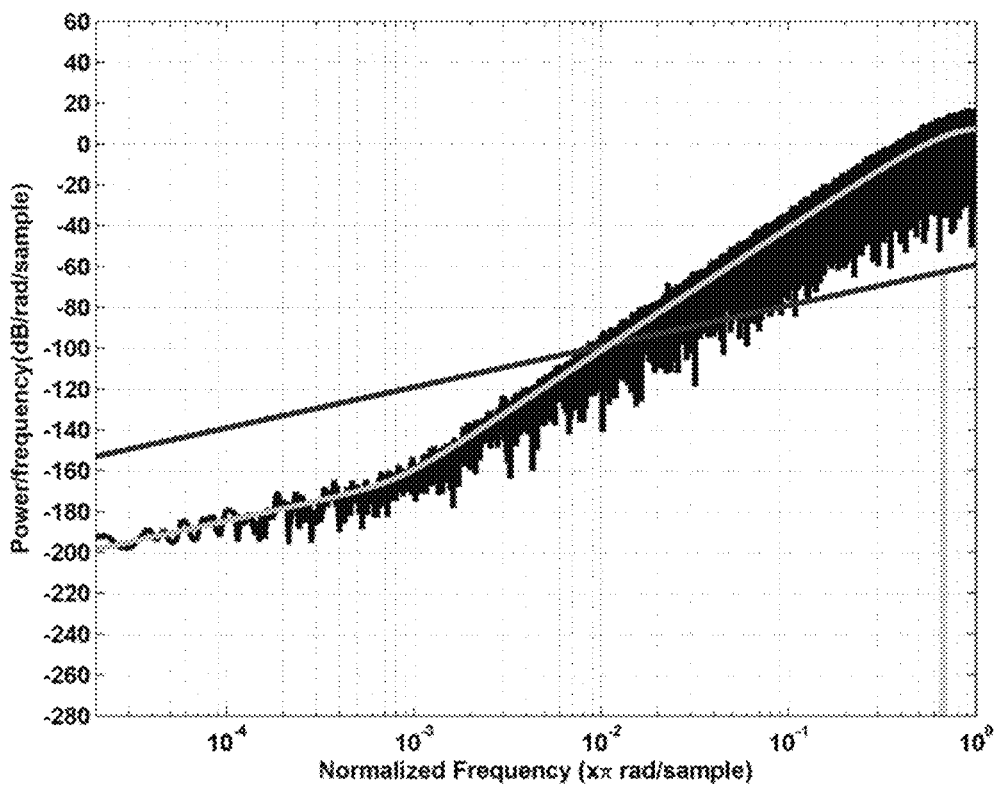
FIG. 9 illustrates that the spectrum of a nested 1-3 MASH DDSM will not exhibit spurs when Eq. (8) is satisfied, in which $N_f=2^{19}$, $x_1=N_1=203434$, $M_1=262144$, $x_2=N_2=2$, $M_2=3$.

This problem was first addressed in M. P. Kennedy, H. Mo, B. Fitzgibbon, A. Harney, H. Shanan, and M. Keaveney, "0.3-4.3 GHz Frequency-Accurate Fractional-N Frequency Synthesizer With Integrated VCO and Nested Mixed-Radix Digital Modulator-Based Divider Controller," IEEE Journal of Solid-State Circuits, vol. 49, no. 7, pp. 1595-1605, July 2014, where it was determined that:

$$M_2 \leq \sqrt[4]{\frac{(2\pi)^6 M_1^2}{12 N_f}}. \quad (8)$$

will guarantee that any tones from DDSM2 are spectrally masked by the shaped quantization noise from DDSM1. When the constraint (8) is satisfied, the feedthrough spur from the auxiliary modulator at level 2 is masked by the shaped quantization noise from the main DDSM at level 1, as shown in FIG. 9.

Two-Level Nested Cascaded 3-3 MASH DDSM with Additive LSB Dither

Figure 10:
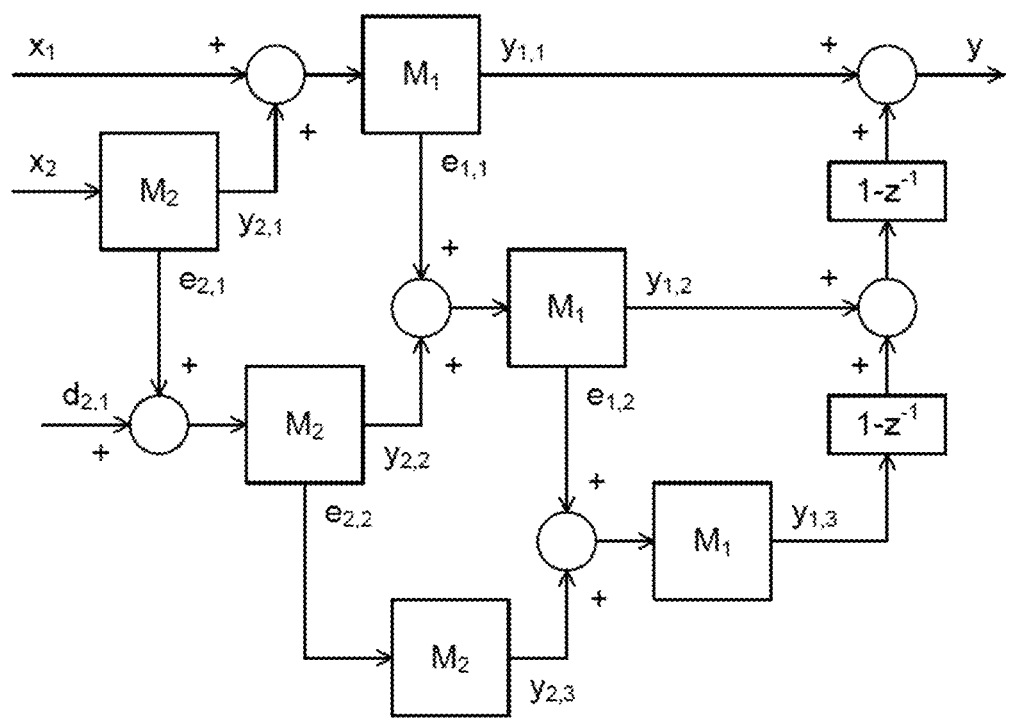
FIG. 10 illustrates a block diagram of two-level nested 3-3 MASH DDSM which has three EFM1 stages per level.

FIG. 10 shows a block diagram of the nested cascaded 3-3 MASH DDSM with first-order shaped additive LSB dither according to one embodiment of the invention. The introduction of additional Error Feedback-Modulator (EFM$_1$) modulator stages ensures that the nested (level-2) auxiliary modulator is third- rather than first-order, and a dither signal can therefore be applied to the auxiliary (rather than the main) modulator. This prevents spurs from being produced by the auxiliary modulator. Feedthrough spurs at the output are thus eliminated by ensuring that they are not introduced by the dithered auxiliary modulator. Furthermore, the number of nesting levels can be increased to provide a speed advantage over the conventional large-modulus implementation.

The pseudorandom dither signal $d_{2,1}$ added at the input of the second stage of the second level of the cascade makes both Eq$_{1,3}$ and Eq$_{2,3}$ noise like. In this case, $$Y_{2,1}(z) = \frac{1}{M_2} X_2(z) + (1 - z^{-1})E_{q2,1}(z),$$

$$Y_{2,2}(z) = \frac{1}{M_2}(E_{2,1}(z) + D_{2,1}(z)) + (1 - z^{-1})E_{q2,1}(z),$$

$$Y_{2,3}(z) = \frac{1}{M_2} E_{2,2}(z) + (1 - z^{-1})E_{q2,3}(z),$$

giving $$Y(z) = \frac{1}{M_1}\left(X_1(z) + \frac{1}{M_2} X_2(z)\right) + (1 - z^{-1})^3 E_{q1,3}(z) +$$
$$\frac{1}{M_1}(1-z^{-1})^2 E_{q2,3}(z) + \frac{1}{M_1 M_2}(1-z^{-1})D_{2,1}(z).$$

Quantization noise from the second level is third-order shaped and is inherently masked by the shaped quantization noise from DDSM$_1$. Thus, $$S_Y(f) = \frac{1}{12}\left(2\sin\left(\frac{\pi f}{f_s}\right)\right)^6 \qquad (9)$$

$$+ \frac{1}{12}\left(\frac{1}{M_1}\right)^2\left(2\sin\left(\frac{\pi f}{f_s}\right)\right)^2 \qquad (10)$$

$$+ \frac{1}{4}\left(\frac{1}{M_1 M_2}\right)^2\left(2\sin\left(\frac{\pi f}{f_s}\right)\right)^2. \qquad (11)$$

Figure 11:
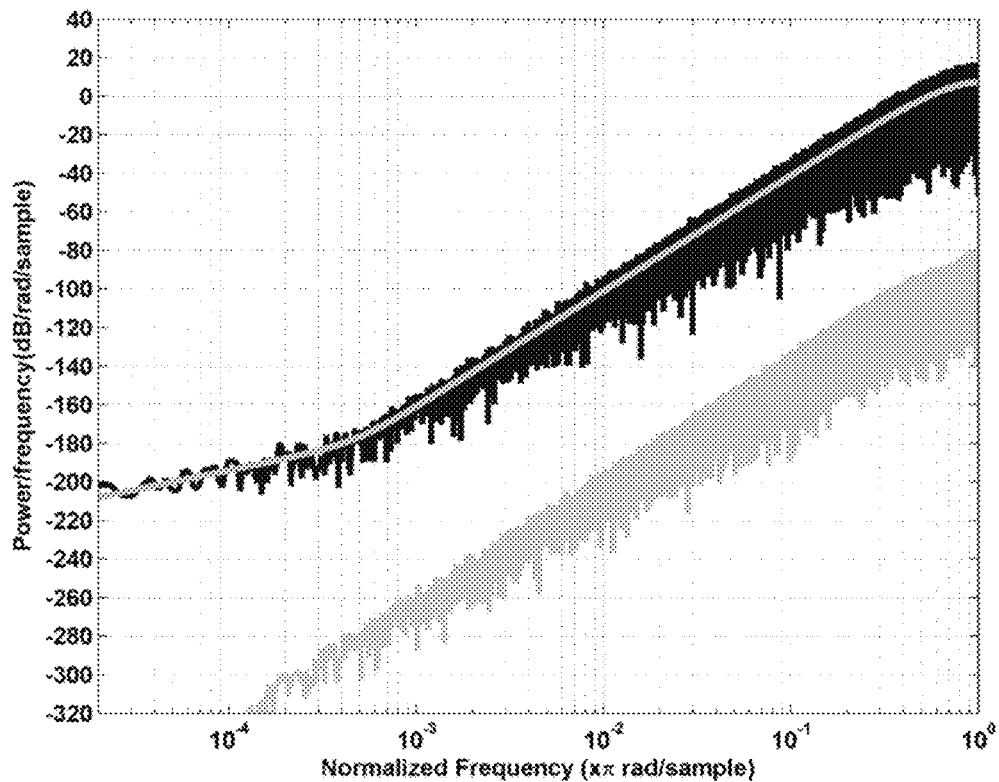
FIG. 11 illustrates the expected spectral envelope defined by Eqs. (9) and (11) for $M_1=2^{18}=262144$.

The spectrum of y is shown in FIG. 11. The simulated spectrum with $N_1$=203434, $N_2$=2, $M_2$=3, 24-bit LFSR dither and $N_f$=2$^{19}$. The contribution from the level 2 modulators, defined by Eq. (10), is shown. By contrast with the nested 3-1 architecture, the level-2 modulator is third-order in the nested cascaded 3-3 case. It is also first-order dithered and consequently spur-free.

Although the dither component is only first-order shaped, and therefore protrudes above the spectral envelope of the contribution from DDSM$_1$ at low frequencies, as in the MASH 1-3 case, it is scaled by $$\left(\frac{1}{M_1 M_2}\right)^2$$

making it small in the case of a large product $M_1 M_2$.

Because the level-2 modulator is third-order and dithered, this architecture can guarantee both zero systematic frequency error and no feedthrough spurs in the output spectrum of the DDSM.

The maximum speed of the nested cascaded MASH (NC-MASH) architecture is limited by the largest modulus $M_i$ at any level i of the cascade. By distributing the DDSM cascade over more than two levels, the sizes of the individual moduli can be reduced, resulting in faster computations in the EFM1 stages.

The NC-MASH is characterized by a trade-off between area and speed, as the reduction in worst-case delay comes at the expense of additional flip flops that are required to store the intermediate and output signals. The adder latency accounts for most of the computation delay. By splitting the total division factor M between L levels (where M= $M_1 \times M_2 \times \ldots \times M_L$), the delay per level can be reduced, resulting in a significant improvement in speed.

Figure 12:
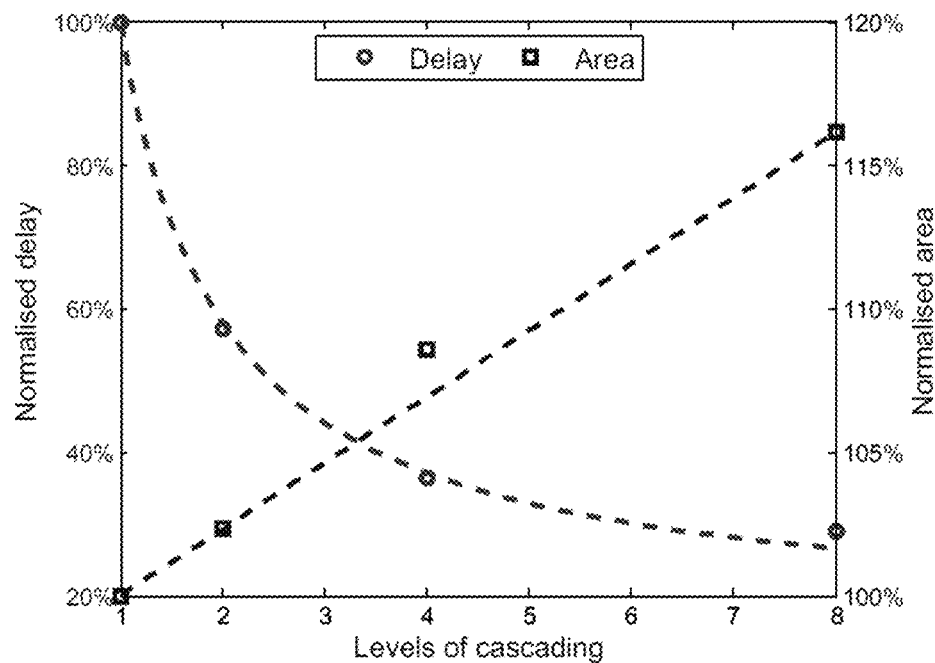
FIG. 12 shows the normalised delay and area plotted versus the number of levels of cascading for a nested cascaded MASH 1-1-1.

FIG. 12 shows the predicted (dashed curves) and simulated (open circles and squared) area and delay for a 16-bit NC-MASH distributed over 2, 4, and 8 levels compared to a conventional 16-bit MASH 1-1-1. The area scales as L, where L is the number of levels; by contrast, the delay scales as 1/L. With four levels of cascading, the area increases by less than 9% compared to the conventional MASH 1-1-1 but the speed increases by a factor of three.

A four-level nested cascaded MASH DDSM is described below which achieves high speed, zero systematic frequency error and no feedthrough spurs, using a maximum modulus of $2^6$ instead of $2^{18}$.

Figure 13:
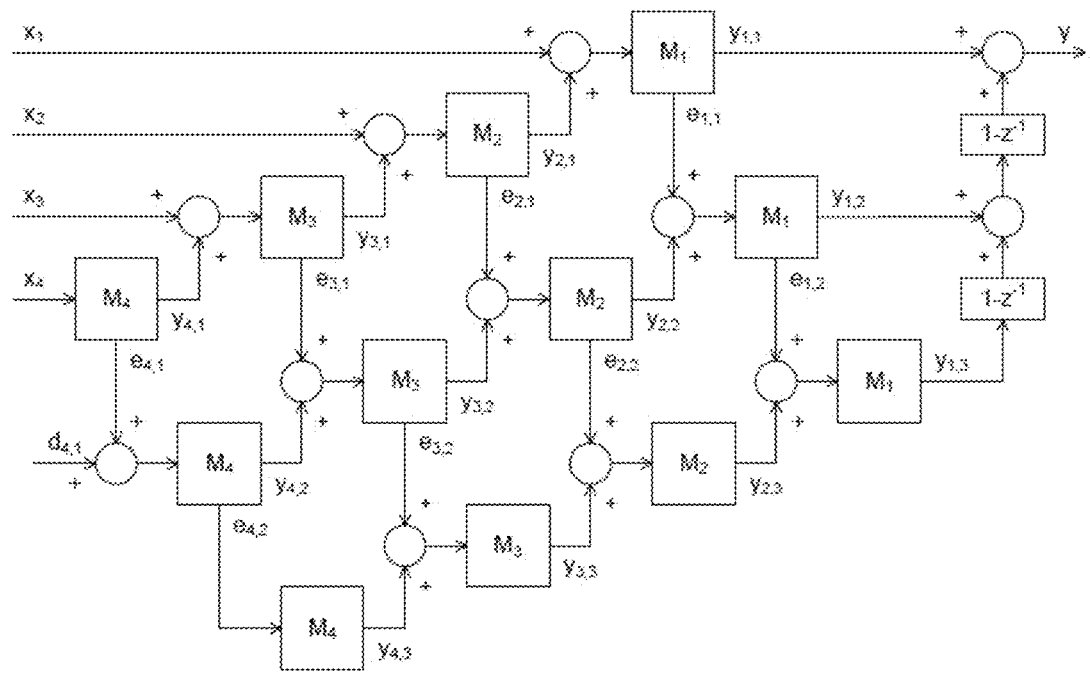
FIG. 13 illustrates a block diagram of a four-level nested cascaded MASH 1-1-1 DDSM with first-order dither.

FIG. 13 illustrates a block diagram of a four-level nested cascaded MASH 1-1-1 DDSM with first-order shaped additive LSB dither.

The output of the error cancellation network is:

$$Y(z)=Y_{1,1}(z)+(1-z^{-1})Y_{1,2}(z)+(1-z^{-1})^2 Y_{1,3}(z),$$

as before, where $$Y_{1,1}(z) = \frac{1}{M_1}(X_1(z) + Y_{2,1}(z)) + (1 - z^{-1})E_{q1,1}(z),$$

$$Y_{1,2}(z) = \frac{1}{M_1}(E_{1,1}(z) + Y_{2,2}(z)) + (1 - z^{-1})E_{q1,2}(z),$$

$$Y_{1,3}(z) = \frac{1}{M_1}(E_{1,2}(z) + Y_{2,3}(z)) + (1 - z^{-1})E_{q1,3}(z),$$

$$Y_{2,1}(z) = \frac{1}{M_2}(X_2(z) + Y_{3,1}(z)) + (1 - z^{-1})E_{q2,1}(z),$$

$$Y_{2,2}(z) = \frac{1}{M_2}(E_{2,1}(z) + Y_{3,2}(z)) + (1 - z^{-1})E_{q2,2}(z),$$

$$Y_{2,3}(z) = \frac{1}{M_2}(E_{2,2}(z) + Y_{3,3}(z)) + (1 - z^{-1})E_{q2,3}(z),$$

$$Y_{3,1}(z) = \frac{1}{M_3}(X_3(z) + Y_{4,1}(z)) + (1 - z^{-1})E_{q3,1}(z),$$

-continued $$Y_{3,2}(z) = \frac{1}{M_3}(E_{3,1}(z) + Y_{4,2}(z)) + (1-z^{-1})E_{q3,2}(z),$$

$$Y_{3,3}(z) = \frac{1}{M_4}(E_{3,2}(z) + Y_{4,3}(z)) + (1-z^{-1})E_{q3,3}(z),$$

and $$Y_{4,1}(z) = \frac{1}{M_4}X_4(z) + (1-z^{-1})E_{q4,1}(z),$$

$$Y_{4,2}(z) = \frac{1}{M_4}(E_{4,1}(z) + D_{4,1}(z)) + (1-z^{-1})E_{q4,2}(z),$$

$$Y_{4,3}(z) = \frac{1}{M_4}E_{4,2}(z) + (1-z^{-1})E_{q4,3}(z).$$

This gives $$Y(z) = \frac{1}{M_1}\left(X_1(z) + \frac{1}{M_2}\left(X_2(z) + \frac{1}{M_3}\left(X_3(z) + \frac{1}{M_4}X_4\right)\right)\right) +$$

$$(1-z^{-1})^3 E_{q1,3}(z) + \frac{1}{M_1}(1-z^{-1})^3 E_{q2,3}(z) + \frac{1}{M_1 M_2}(1-z^{-1})^3 E_{q3,3}(z) +$$

$$\frac{1}{M_1 M_2 M_3}(1-z^{-1})^3 E_{q1,3}(z) + \frac{1}{M_1 M_2 M_3 M_4}(1-z^{-1})D_{4,1}(z)$$

Quantization noise contributions from modulators at levels 4, 3 and 2 are third-order shaped and inherently masked by the shaped quantization noise from level 1. In particular, $$S_Y(f) = \frac{1}{12}\left(2\sin\left(\frac{\pi f}{f_s}\right)\right)^6 \quad (12)$$

$$+ \frac{1}{12}\left(\frac{1}{M_1}\right)^2\left(2\sin\left(\frac{\pi f}{f_s}\right)\right)^6 \quad (13)$$

$$+ \frac{1}{12}\left(\frac{1}{M_1 M_2}\right)^2\left(2\sin\left(\frac{\pi f}{f_s}\right)\right)^6 \quad (14)$$

$$+ \frac{1}{12}\left(\frac{1}{M_1 M_2 M_3}\right)^2\left(2\sin\left(\frac{\pi f}{f_s}\right)\right)^6 \quad (15)$$

$$+ \frac{1}{4}\left(\frac{1}{M_1 M_2 M_3 M_4}\right)^2\left(2\sin\left(\frac{\pi f}{f_s}\right)\right)^2. \quad (16)$$

Consider again the problem of synthesizing $f_{OUT}$=4225.6 MHz when $f_{PD}$=61.44 MHz with $M_1$=$2^6$, $M_2$=$2^6$, $M_3$=$2^6$ and $M_4$=3. Once again, there is no systematic frequency error:

$$f_{OUT} = \left(68 + \frac{49 + \frac{42 + \frac{42 + \frac{2}{3}}{64}}{64}}{64}\right)61.44 \text{ MHz}$$

$$= 4225.6 \text{ MHz}.$$

Figure 14:
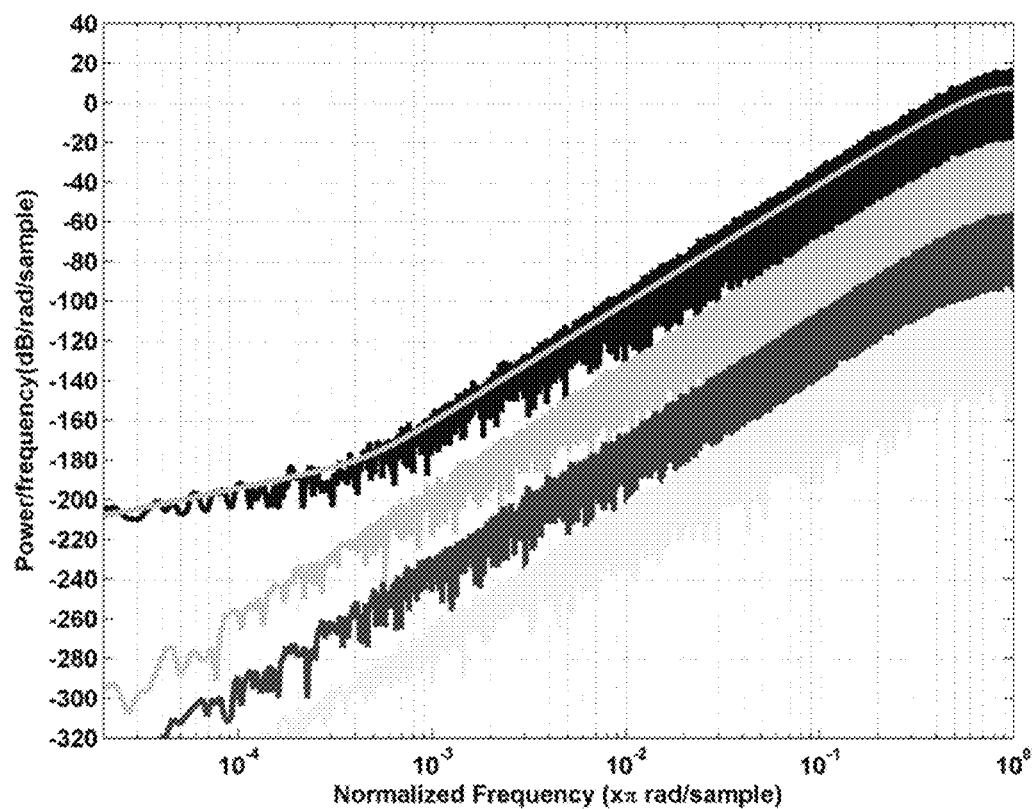
FIG. 14 illustrates predicted and simulated spectra in a four-level nested cascaded 3-3-3-3 MASH 1-1-1 DDSM, in which $N_1=49$, $M_1=64$, $N_2=42$, $M_2=64$, $N_3=42$, $M_3=64$, $N_4=2$, $M_4=3$, s[0]=0, 20-bit LFSR dither.

The spectral components and the predicted spectra are shown in FIG. 14. The power spectrum of the output y, denoted $S_Y$, shown starting at −200 dB (dark shading), matches the solid curve prediction defined by Eqs. (12) and (16). The simulated shaped quantization noise from levels 2, 3, and 4 (whose stages have moduli $M_2$, $M_3$, and $M_4$) are shown (with lighter shading and spaced by approximately −20 dB each) below $S_Y$ in FIG. 12.

The nested mixed-radix DDSM can guarantee zero systematic frequency error when used as a divider controller in a fractional-N frequency synthesizer. Such a general fractional-N frequency synthesizer is shown M. P. Kennedy, H. Mo, B. Fitzgibbon, A. Harney, H. Shanan, and M. Keaveney, "0.3-4.3 GHz Frequency-Accurate Fractional-N Frequency Synthesizer With Integrated VCO and Nested Mixed-Radix Digital Modulator-Based Divider Controller," IEEE Journal of Solid-State Circuits, vol. 49, no. 7, pp. 1595-1605, July 2014. However, a drawback of that architecture is that it may suffer from spurs due to feedthrough of a periodic signal from the auxiliary modulator.

This disclosure presents a nested cascaded mixed-radix DDSM architecture which can also guarantee zero systematic frequency error. In addition, it allows one to use higher order auxiliary modulators and shaped dither to eliminate feedthrough spurs completely. By increasing the number of levels in the cascade, the moduli of the individual modulator stages can be reduced, thereby increasing the speed of the synthesizer.

The simplest structure which enables exact frequency synthesis is the two-level architecture, which was demonstrated with an 18-bit main modulator. By increasing the number of stages in the auxiliary (level 2) modulator from one to three, its feedthrough tones are eliminated. By increasing the number of levels to four, the complexity of the adders was reduced in the modulator stages from 18 bits to 6 bits.

It will be appreciated that a computer program comprising program instructions for causing a computer program to control the operation of the divider controller, which may be embodied on a record medium, carrier signal or read-only memory.

The embodiments in the disclosure described with reference to the drawings comprise a computer apparatus and/or processes performed in an integrated circuit. This disclosure also extends to computer programs, particularly computer programs stored on or in a carrier adapted to control operation of the frequency synthesizer as described herein. The program may be in the form of source code, object code, or a code intermediate source and object code, such as in partially compiled form or in any other form suitable for use in the implementation of the method according to the invention. The carrier may comprise a storage medium such as ROM, e.g. CD ROM, or magnetic recording medium, e.g. a floppy disk or hard disk. The carrier may be an electrical or optical signal which may be transmitted via an electrical or an optical cable or by radio or other means.

In the specification the terms "comprise, comprises, comprised and comprising" or any variation thereof and the terms include, includes, included and including" or any variation thereof are considered to be totally interchangeable and they should all be afforded the widest possible interpretation and vice versa.

The invention is not limited to the embodiments hereinbefore described but may be varied in both construction and detail.

The invention claimed is:
1. A fractional-N frequency synthesizer comprising:
a divider controller having a main $n^{th}$ order modulator and an auxiliary $n^{th}$ order modulator, wherein a noise shaping of the auxiliary $n^{th}$ order modulator is the same order as a noise shaping of the main $n^{th}$ order modulator, and wherein n is an integer value greater than one and the divider controller comprises a plurality of error feedback modulator stages connected in a two-level nested cascaded multi-stage noise shaping (MASH) digital delta-sigma modulator (DDSM) with a single error cancellation network.

2. The fractional-N frequency synthesizer of claim 1 wherein the auxiliary $n^{th}$ order modulator comprises at least two first-order Error Feedback Modulator ($EFM_1$) stages.

3. The fractional-N frequency synthesizer of claim 2 wherein at least one $EFM_1$ stage of the at least two $EFM_1$ stages in the auxiliary $n^{th}$ order modulator is configured to apply a dither signal to the main $n^{th}$ order modulator.

4. The fractional-N frequency synthesizer of claim 2 wherein the at least two $EFM_1$ stages are configured to operate as a nested (level-2) auxiliary modulator.

5. The fractional-N frequency synthesizer of claim 1 wherein the auxiliary $n^{th}$ order modulator comprises three $EFM_1$ stages each with modulus $M_2$.

6. The fractional-N frequency synthesizer of claim 1 wherein the main $n^{th}$ order modulator has a power-of-two modulus and a modulus of the auxiliary $n^{th}$ order modulator is not a power-of-two, wherein a speed of operation of the divider controller is increasable by splitting the power-of-two modulus over more than one level.

7. The fractional-N frequency synthesizer of claim 6 wherein the non-power-of-two modulus of the auxiliary $n^{th}$ order modulator is split over multiple levels.

8. The fractional-N frequency synthesizer of claim 1 wherein one or more stages of the auxiliary $n^{th}$ order modulator and one or more stages of the main $n^{th}$ order modulator are connected in a two-level nested cascade.

9. The fractional-N frequency synthesizer of claim 1 wherein a separate dither signal applies a least significant bit (LSB) dither.

10. The fractional-N frequency synthesizer of claim 1 comprising one or more additional modulator stages, so that the auxiliary $n^{th}$ order modulator is a third-order system.

11. The fractional-N frequency synthesizer of claim 1 wherein the divider controller is configured to operate with a plurality of individual moduli and comprises a plurality of modulator stages, wherein the sizes of the individual moduli are reduced by cascading modulator stages over more than two levels.

12. The fractional-N frequency synthesizer of claim 1 wherein the order of the auxiliary $n^{th}$ order modulator is three and a spectrum of the auxiliary $n^{th}$ order modulator is spur-free.

13. The fractional-N frequency synthesizer of claim 1 wherein the order of the main $n^{th}$ order modulator and the auxiliary $n^{th}$ order modulator is four.

14. The fractional-N frequency synthesizer of claim 1 wherein the divider controller is configured to receive a dither signal, wherein an LSB dither component of the dither signal is first-order shaped.

15. The fractional-N frequency synthesizer of claim 14 wherein the dither component protrudes above a spectral envelope of a contribution from the main $n^{th}$ order modulator at low frequencies, and is scaled by a factor $$\left(\frac{1}{M_1 M_2}\right)^2.$$

16. The fractional-N frequency synthesizer of claim 1 wherein the divider controller comprises a four-level nested cascaded MASH 1-1-1 DDSM, wherein a dither signal provides a first-order shaped additive LSB dither.

17. The fractional-N frequency synthesizer of claim 1 wherein a dither signal is applied to the auxiliary $n^{th}$ order modulator.

18. A modulator system for use in a fractional-N frequency synthesizer, said modulator system comprising:
a divider controller having a main $n^{th}$ order modulator and an auxiliary $n^{th}$ order modulator, wherein a noise shaping of the auxiliary $n^{th}$ order modulator is the same order as a noise shaping of the main $n^{th}$ order modulator, and wherein n is an integer value greater than one, and wherein the divider control comprises a plurality of error feedback modulator stages connected in a two-level nested cascaded multi-stage noise shaping (MASH) digital delta-sigma modulator (DDSM) with a single error cancellation network.

19. A fractional-N frequency synthesizer comprising:
a divider controller having a main $n^{th}$ order modulator and an auxiliary $k^{th}$ order modulator, wherein a value of n or k comprises an integer number greater than one, and wherein the divider control comprises a plurality of error feedback modulator stages connected in a two-level nested cascaded multi-stage noise shaping (MASH) digital delta-sigma modulator (DDSM) with a single error cancellation network.

20. The fractional-N frequency synthesizer of claim 19, further comprising:
a controllable oscillator configured to generate a clock signal; and
a feedback divider configured to divide the clock signal, wherein the divider controller is configured to control a divisor of the feedback divider.

* * * * *